United States Patent
Kong et al.

(10) Patent No.: US 7,590,960 B1
(45) Date of Patent: Sep. 15, 2009

(54) PLACING PARTITIONED CIRCUIT DESIGNS WITHIN ITERATIVE IMPLEMENTATION FLOWS

(75) Inventors: Raymond Kong, San Francisco, CA (US); Navaratnasothie Selvakkumaran, Campbell, CA (US); Kamal Chaudhary, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 260 days.

(21) Appl. No.: 11/787,925

(22) Filed: Apr. 18, 2007

(51) Int. Cl.
*G06F 17/50* (2006.01)

(52) U.S. Cl. ............ 716/9; 716/7; 716/8; 716/10; 716/11; 716/12; 716/16; 716/17

(58) Field of Classification Search ............. 716/4–5, 716/7–12, 16–17
See application file for complete search history.

(56) References Cited

U.S. PATENT DOCUMENTS

| | | | |
|---|---|---|---|
| 6,711,729 B1 * | 3/2004 | McElvain et al. | 716/18 |
| 7,146,583 B1 | 12/2006 | Sun et al. | |
| 7,171,644 B1 | 1/2007 | Laurence et al. | |
| 7,181,704 B1 | 2/2007 | Downs et al. | |
| 7,197,734 B1 * | 3/2007 | Singh et al. | 716/8 |
| 7,308,666 B1 * | 12/2007 | Li | 716/7 |

OTHER PUBLICATIONS

U.S. Appl. No. 10/913,000 by Kong et al., filed Aug. 6, 2004 by Xilinx, Inc.
U.S. Appl. No. 10/913,752 by Downs et al., filed Aug. 6, 2004 by Xilinx, Inc.

* cited by examiner

*Primary Examiner*—Thuan Do
*Assistant Examiner*—Nghia M Doan
(74) *Attorney, Agent, or Firm*—Kevin T. Cuenot; LeRoy D. Maunu

(57) ABSTRACT

A method of placing circuit elements of a partitioned circuit design on a target programmable logic device (PLD) can include mapping circuit elements of the circuit design to corresponding partitions of the circuit design, selecting a circuit element of the circuit design, and selecting a candidate location within a logic boundary on the target PLD. The method also can include validating the candidate location for the selected circuit element, at least in part, according to whether the selected circuit element belongs to a same partition of the circuit design as at least one other circuit element already placed within the logic boundary. The selected circuit element can be selectively placed at the candidate location according to the validation.

19 Claims, 2 Drawing Sheets

PLACING PARTITIONED CIRCUIT DESIGNS WITHIN ITERATIVE IMPLEMENTATION FLOWS

FIELD OF THE INVENTION

The embodiments disclosed herein relate to the field of Electronic Design Automation and, more particularly, to placing partitioned circuit designs in the context of iterative implementation flows.

BACKGROUND

Software-based Electronic Design Automation (EDA) tools, in general, can process circuit designs through what is referred to as an implementation flow to implement the circuit design within a given target programmable logic device (PLD). A circuit design can be specified in programmatic form, e.g., as a netlist, as one or more hardware description language files, or the like. A typical implementation flow entails various phases, or stages, such as synthesis, translation, packing, placement, and routing. The resulting circuit design is transformed into a bitstream that, when loaded into the target PLD, configures the target PLD to implement the circuit design.

Modern EDA tools also support iterative implementation flows. An iterative implementation flow is characterized by more than one pass through one or more or all phases of an implementation flow. With an iterative implementation flow, the EDA tools must be able to process an existing implementation or a partial implementation of the circuit design. Typically, after a first pass through one or more phases of an implementation flow, the user makes some change to the existing circuit design. Such a change can include, but is not limited to, an HDL change, a timing requirement change, a physical packaging change, a physical floor-planning change, a design attribute change, etc. The circuit design is re-implemented in that it is processed through one or more of the phases of the implementation flow such that the changes are applied to the existing implementation, whether whole or partial, of the circuit design. That is, the changes are applied to a version of the circuit design that was generated from a prior implementation flow or phase of an implementation flow.

Examples of iterative implementation flows can include, but are not limited to, guide exact flow, guide leveraged flow, incremental design flow, and modular design flow. These examples of iterative implementation flows are supported by various software implementation tools available from Xilinx, Inc. of San Jose, Calif. (Xilinx® is a trademark of Xilinx, Inc. in the United States, other countries, or both.) Guide exact flow, for example, attempts to incorporate circuit design changes into the existing circuit design while preserving as much of the previous implementation of the circuit design as possible. Typically, the unchanged portions of the circuit design are "locked" throughout the re-implementation process.

Guide leverage flow refers to a process in which circuit design changes are incorporated into the existing circuit design, but implementation, or re-implementation, runtime is minimized. Runtime minimization usually entails taking the unchanged portions of the circuit design as the starting point and allowing changes to be applied to the circuit design, including the unchanged portions, as needed to implement the specified changes.

Incremental design flow refers to a process that combines objectives of guide exact and guide leverage flows into a single flow. In an incremental flow, the circuit design is divided into smaller pieces referred to as "partitions". For each partition that is not affected by a "current" change, the EDA tool re-applies the previous implementation of that partition. The EDA tool may alter the previous implementation of various partitions to the extent permitted by user assigned attributes associated with each respective partition of the circuit design.

Modular design flow refers to a divide-and-conquer technique in which a circuit design is subdivided, or partitioned, into a plurality of sub-designs. Each sub-design can be implemented independently of the others. This approach is suited for team environments in which different teams of developers are tasked with developing different sub-designs.

In each of these iterative implementation flow examples, the EDA tool must process an implemented, or partially implemented, circuit design into a feasible circuit design, i.e., one that can be successfully implemented on a target PLD. To this extent, other circuit design techniques also can be viewed as iterative implementation flows. For example, the inclusion of hard macros which specify placed and routed components, into a circuit design may be considered a type of iterative implementation flow.

Most PLDs, for example field programmable gate arrays, are constrained with respect to the number, or amount, of circuit resources that can be provided. Such constraints stem from a variety of factors including overall chip area. As a result, there typically is a large number of wires versus the number of available programmable interconnect points (PIPs) on a device. This means that each wire on the PLD cannot connect to each other wire on the PLD. Instead, wiring connectivity is carefully designed to maximize connectivity and circuit performance through the limited number of PIPs that are provided.

Limited routing connectivity associated with PLDs can create a number of circuit design challenges that EDA tools must address in order to generate feasible circuit implementations. For example, limited routing connectivity influences the placement phase of an implementation flow, particularly in the context of iterative implementation flows.

SUMMARY

The present invention relates to placing partitioned circuit designs in the context of iterative implementation flows. One embodiment of the present invention can include a computer-implemented method of placing circuit elements of a partitioned circuit design on a target programmable logic device (PLD). The method can include mapping circuit elements of the circuit design to corresponding partitions of the circuit design, selecting a circuit element of the circuit design, and selecting a candidate location within a logic boundary on the target PLD. The candidate location for the selected circuit element can be validated, at least in part, according to whether the selected circuit element belongs to a same partition of the circuit design as at least one other circuit element already placed within the logic boundary. The selected circuit element can be selectively placed at the candidate location according to the validation. A placed circuit design is generated and output, for example, to a user, a computer file, or to another computer program.

In one embodiment, the method can include defining a plurality of logic boundaries on the target PLD. Each logic boundary can be defined by a plurality of logic cells directly connected to a routing matrix.

Validating the candidate location for the selected circuit element can include determining that no other circuit elements of the circuit design have been placed within the logic boundary, such that selectively placing the selected circuit element at the candidate location places the selected circuit element at the candidate location. Validating the candidate location for the selected circuit element also can include identifying at least one other circuit element of the circuit design previously placed within the logic boundary. Validating the candidate location for the selected circuit element further can include comparing the partition of the selected circuit element with a partition of one or more other selected circuits element previously placed within the logic boundary.

Selectively placing the selected circuit element at the candidate location can include placing the selected circuit component at the candidate location if the partition of the selected circuit element is the same partition to which the other circuit element(s) previously placed within the logic boundary belong. Selectively placing the selected circuit element at the candidate location also can include rejecting the candidate location if the partition of the selected circuit element is not the same partition to which the other circuit element(s) previously placed within the logic boundary belong. In that case, a different candidate location for placing the selected circuit element can be selected.

In another embodiment, validating the candidate location for the selected circuit element can include determining that the partition of the selected circuit element is the same partition to which each other circuit element previously placed within the logic boundary belongs, such that the selected circuit element is placed at the candidate location, or determining that the partition of the selected circuit element is not the same partition to which each other circuit element previously placed within the logic boundary belongs, such that the candidate location is rejected.

Further circuit elements and candidate locations can be processed, if desired, when generating the placed circuit design.

Another embodiment of the present invention can include a computer-implemented method of placing circuit elements of a partitioned circuit design on a target PLD. The method can include determining partition membership for circuit elements of the circuit design, selecting a circuit element of the circuit design and a candidate location within a logic boundary on the target PLD, and determining whether the logic boundary includes one or more previously placed circuit elements belonging to a partition. The method also can include placing the circuit element at the candidate location if a partition to which the selected circuit element belongs is the same partition to which the previously placed circuit element(s) belong, or if the logic boundary comprises no previously placed circuit elements. A placed circuit design is generated and output, for example, to a user, a computer file, or to another computer program.

If the logic boundary includes one or more previously placed circuit elements, the partition(s) of the previously placed circuit element(s) can be compared with the partition of the selected circuit element. If the logic boundary includes one or more previously placed circuit elements belonging to a partition that is not the same as the partition of the selected circuit element, the candidate location can be rejected and a different candidate location can be selected.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

Figure 1:
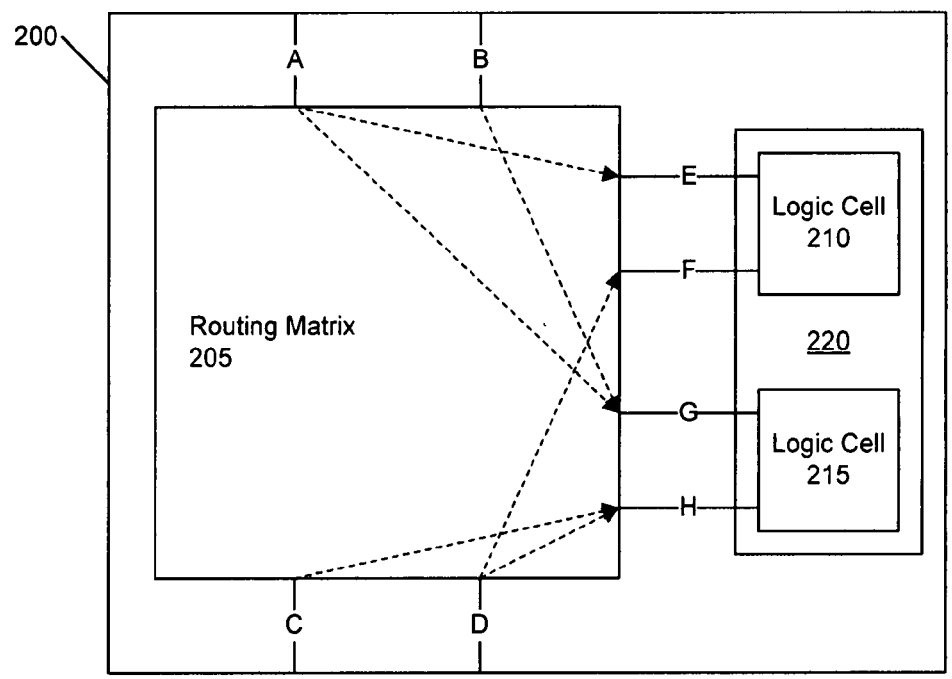
FIG. 1 is a block diagram illustrating a logic boundary of a programmable logic device (PLD) which is useful for understanding the embodiments disclosed herein.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to the placement of circuit designs in the context of iterative implementation flows. Within iterative implementation flows, circuit designs typically are subdivided, or partitioned, into a plurality of partitions. A "partition" refers to a portion of a circuit design. In general, partitions support hierarchical relationships commonly used within a hardware description language (HDL) representation of a circuit design. Implementation data from a prior implementation flow can be associated with corresponding partitions. When the circuit design is re-implemented subsequent to a change in the circuit design, e.g., a design iteration or implementation flow is performed, implementation data corresponding to unchanged partitions of the circuit design can be re-used to the extent allowed by attributes associated with each respective partition.

As noted, the available area of an integrated circuit (IC) often limits the number of programmable interconnect points (PIPs) that can be included on an IC. This limits the connectivity available on the IC, as there are not enough PIPs to allow each wire to connect to each other wire. As a result, some wires serve as the only signal path into, or out of, a selected logic cell of the target programmable logic device (PLD). When such a wire is used for a different logic cell, that wire is unavailable for use with the selected logic cell. This can lead to a routing conflict in which the selected logic cell becomes unusable since there may be no other wires available to route signals to and/or from the selected logic cell.

In accordance with the embodiments disclosed herein, a validation check can be applied during placement of circuit elements to available locations of the target PLD. This validation check can ensure that a given logic boundary will include only circuit elements that belong to the same partition. As such, the circuit elements of the same partition will likely be placed and routed during the same design iteration, i.e., implementation flow, thereby reducing the likelihood that a routing conflict will be encountered.

FIG. 1 is a block diagram illustrating a logic boundary 200 of a PLD which is useful for understanding the embodiments disclosed herein. As shown, the logic boundary 200 can include a routing matrix 205 and two logic cells 210 and 215 located within a configurable logic block (CLB) 220. As used herein, a logic cell can refer to a portion of a CLB referred to as a slice, for example. Slices and CLBs are programmable logic structures commonly found on field programmable gate array (FPGA) type PLDs commercially available from Xilinx, Inc. of San Jose, Calif.

The logic boundary 200, in general, can be characterized, at least in part, by a routing matrix or routing switch, and one or more logic cells or other logic structures that are directly connected, e.g., by a single wire with no intervening PIPs, to that routing mechanism. The logic boundary can be determined by identifying a routing matrix and determining the number of logic cells that directly connect to that routing matrix. For example, with respect to FIG. 1, the logic boundary is characterized by the routing matrix 205 and the CLB 220. The logic boundary, however, can include a different number of CLBs or other comparable logic structures depending upon the particular architecture of the target PLD that is being used. For example, if the routing matrix 205 were directly connected to two CLBs, the logic boundary 200 would be defined to include the routing matrix 205, the CLB 220, and the second CLB. As such, the embodiments disclosed herein are not intended to be limited by the particular number of CLBs or other logic structures included within the logic boundary 200.

Additionally, it should be appreciated that a CLB can include a different number of slices or logic cells than is depicted in FIG. 1. Two logic cells have been depicted within the CLB 220 for purposes of convenience and ease of illustration. As is known, however, CLBs can include additional slices depending upon the particular architecture of the target PLD. For example, some FPGAs have CLBs with four slices. In any case, the embodiments disclosed herein are not intended to be limited by the particular number of logic cells or slices included within a CLB or other comparable logic structure.

A plurality of physical wires A, B, C, D, E, F, G, and H of the target PLD are also shown. Each logic cell 210 and 215 is linked to the routing matrix 205 via two wires. Logic cell 210, for example, is linked with the routing matrix 205 via wires E and F. Logic cell 215 is linked with the routing matrix 205 via wires G and H. In order for a logic cell to be functional, each wire linking that logic cell to the routing matrix 205, e.g., each of wires E and F for logic cell 210 or each of wires G and H for logic cell 215, must connect to another wire, e.g., wire A, B, C, or D.

As noted, the area constraints of modern ICs prevent the number of PIPs needed for each wire to connect to each other wire from being implemented within the routing matrix 205. With respect to FIGS. 1 and 2, PIPs have been depicted as dashed lines connecting the various wires leading into or out from the routing matrix 205. In illustration, wire A can link only to wires E or G via one of the two PIPs available for wire A. In an exemplary embodiment, when wire A is connected to wire E, wire A cannot be connected to wire G. Wire B can link only to wire G. Wire C can link only to wire H. Wire D can link only to wire F or H.

Figure 2:
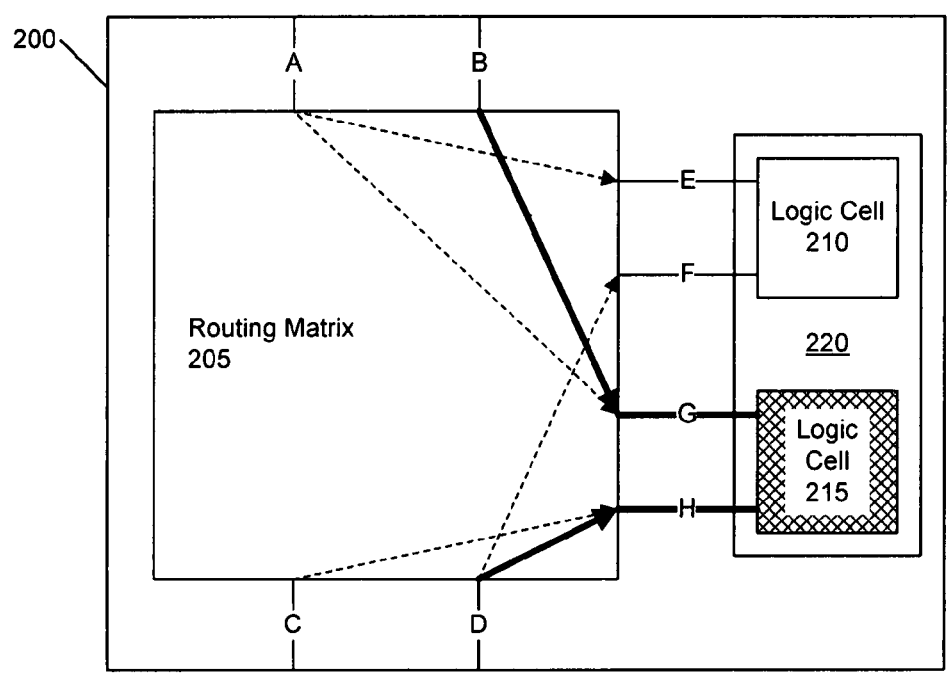
FIG. 2 is a block diagram illustrating the logic boundary of the PLD shown in FIG. 1 after a circuit design has been at least partially implemented.

FIG. 2 is a block diagram illustrating the logic boundary 200 of the PLD shown in FIG. 1 after a circuit design has been at least partially implemented. As noted, the circuit design has undergone an implementation flow such that one or more components of the circuit design have been assigned or placed on the target PLD. Further, the circuit design can be routed, or at least partially routed. FIG. 2 reflects this stage of development of the circuit design. For example, the cross-hatching on logic cell 215 indicates that the site, or location, is occupied by one or more circuit elements of the circuit design. As logic cell 215 is occupied, or "not empty", wire B has been connected to wire G through a PIP in the routing matrix 205. Similarly, wire D has been connected to wire H through a PIP in the routing matrix 205. Logic cell 210, however, remains unoccupied and able to receive, or be placed with, one or more circuit elements of the circuit design. In this regard, logic cell 210 can be said to be "empty" or be referred to as an "empty site".

If circuit elements were to be placed at logic cell 210, it can be seen that wire E can be connected to wire A via the routing matrix 205. The only connection available for wire F, however, is wire D. Since wire D has already been used to connect with wire H for logic cell 215, wire D is unavailable. This creates a routing conflict with respect to logic cell 210 and, more particularly, a blockage with respect to the routing connectivity of wire F and the pin of the logic cell 210 to which wire F is connected. With the implementation shown in FIG. 2, a circuit design having a circuit element placed at logic cell 210 will be infeasible. There would be no way to route signals to and/or from logic cell 210 via wire F. Routing conflicts such as this can stem from placing circuit elements belonging to a same partition in different design iterations. For example, a first circuit element is placed at logic cell 215 and the circuit design is routed. A second circuit element is placed at logic cell 210 during a subsequent design iteration resulting in the conflict. Conventional placers do not account for routing conflicts or partition membership.

In accordance with the embodiments disclosed herein, while placing circuit elements to particular locations, e.g., slices or logic cells, a validation check can be performed to ensure that each circuit element placed within a same logic boundary will be a member of the same partition of the circuit design. In this regard, it is beneficial to select the smallest sized logic boundary that removes or alleviates the routability problem. Defining each logic boundary according to the logic cells that directly connect to a given routing matrix ensures that the size of each logic boundary remains small. With respect to FIG. 2, for example, a circuit element of the circuit design will not be placed at logic cell 210 unless that circuit element is a member of, or belongs to, the same partition as the circuit element located at logic cell 215. Applying this type of validation causes circuit elements belonging to the same partition to be placed during the same design iteration, or implementation flow. In consequence, CLB 220 would be routed after both logic cells 210 and 215 have been placed with circuit elements. The router of the electronic design automation (EDA) tool would avoid the routing conflict previously discussed where wire F of logic cell 210 is unreachable.

Figure 3:
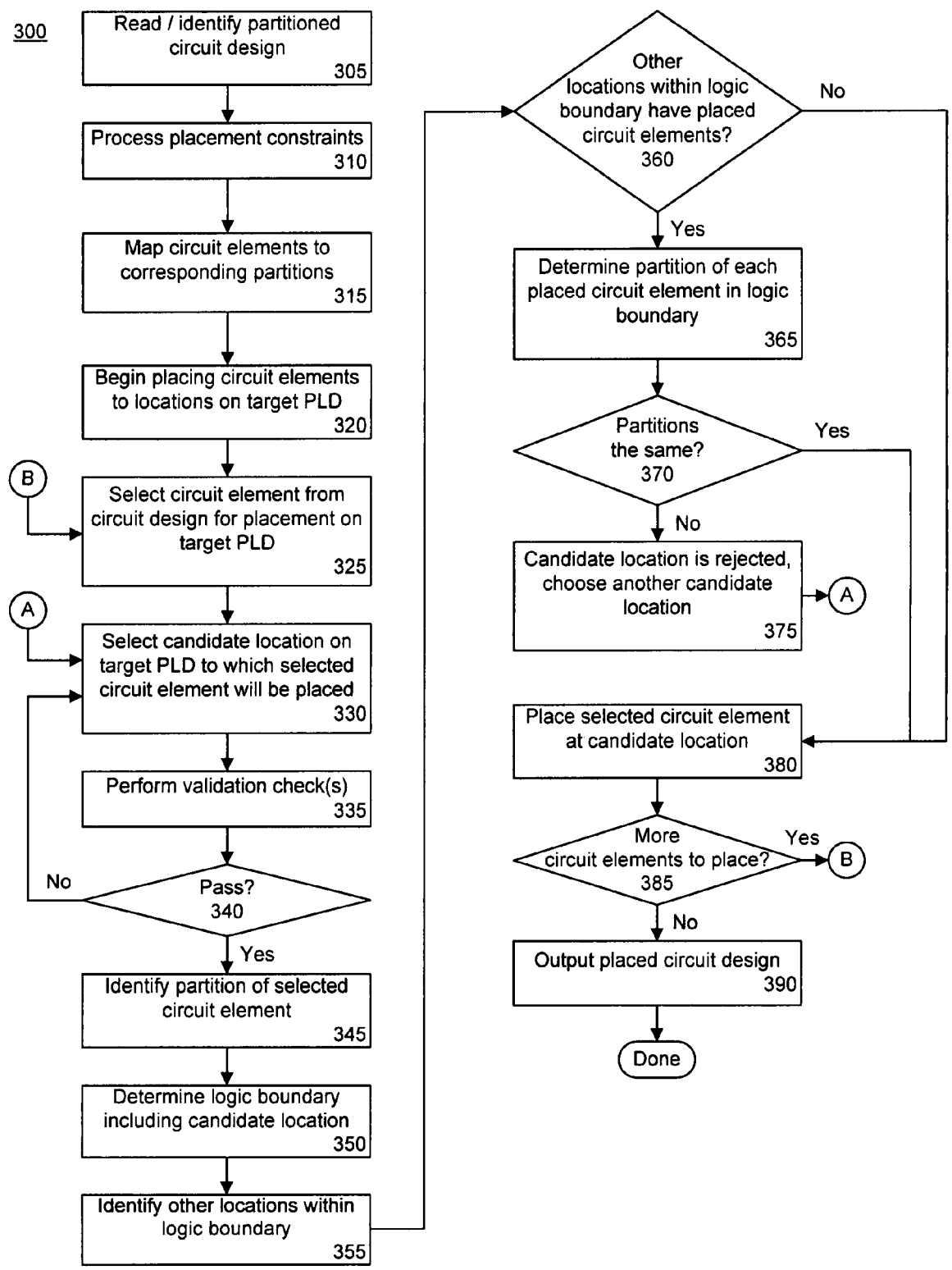
FIG. 3 is a flow chart illustrating a method of placing circuit elements of a circuit design on a target PLD in accordance with another embodiment of the present invention.

FIG. 3 is a flow chart illustrating a method 300 of placing circuit elements of a circuit design on a target PLD in accordance with another embodiment of the present invention. The method 300 represents a process that can be incorporated into a larger placement process, if desired. For example, the method 300 can be implemented as part of a placement method involving multiple passes, such as within an iterative implementation flow.

The method 300 can begin in a state at the beginning of an iterative implementation flow, e.g., prior to the placement of any circuit elements on the target PLD or in a state in which a circuit design has undergone an implementation flow, or at least part of an implementation flow, such that one or more circuit elements have been placed with respect to a given target PLD. Further, a change to the implementation or partial implementation of the circuit design may have been specified, resulting in the need for a further implementation flow or phase of an implementation flow, e.g., placement, to be applied to the modified circuit design.

The method 300 further can begin in a state in which the target PLD has been divided into a plurality of logic boundaries. The EDA tool, being programmed with architectural knowledge of the target PLD, can maintain a listing or mapping of logic cells to logic boundaries. In another embodiment, the EDA tool, having knowledge of the architecture of the target PLD, can dynamically determine, or define, the logic boundaries of the target PLD. As noted, a logic boundary can be characterized by a routing matrix and by any logic cells directly connected to that routing matrix. In this regard, the size of a logic boundary can vary according to the architecture of one type of target PLD to another.

In step 305, a partitioned circuit design can be read into an EDA tool or otherwise be identified by the EDA tool. As indicated, the circuit design may or may not contain partial placement information which has been applied during a previous implementation. As such, the circuit design may be an unplaced circuit design or a partially placed circuit design. In step 310, any placement constraints that have been specified for the circuit design can be processed or identified. In step 315, the circuit elements of the circuit design can be mapped to corresponding partitions. That is, the partition to which each circuit element belongs can be identified. This information can be stored in a data structure that facilitates fast retrieval of the information for comparison purposes as described herein.

In step 320, the EDA tool can begin placing circuit elements to locations of the target PLD. A location can refer to a logic cell or slice as has been described herein. In step 325, a circuit element from the circuit design can be selected for placement on the target PLD. Typically, the circuit element is selected according to timing criticality. Still, it should be appreciated that other selection criteria can be used in lieu of, or in combination with, timing criticality if so desired. In step 330, a candidate location on the target PLD to which the selected circuit component may be placed is selected. The candidate location also can be selected according to timing criticality and/or various other selection criteria. The selection criteria used in step 325 and/or step 330 can vary according to the number of placement passes that have been performed in the context of the overall placement of the circuit design.

In step 335, one or more validation checks can be performed for the selected circuit component and the candidate location. For example, possible validation checks that can be performed can include, but are not limited to, determining whether the candidate location is already occupied with another circuit element, determining whether the candidate location is excluded from use for a given reason or prohibited from usage per the placement constraints, and determining whether the candidate location is capable of receiving or accommodating the selected circuit element.

In step 340, if the candidate location is already occupied, excluded or prohibited, or not suitable for the selected circuit element, the candidate location does not pass the validation check. Accordingly, the candidate site is rejected and the method can loop back to step 330 to select another candidate location. If the candidate location passes, e.g., is not already occupied, is not excluded or prohibited, and is suitable for the selected circuit element, the method can continue to step 345.

In step 345, the partition of the selected circuit element can be identified, or determined, from the mapping data or by searching the implementation data for the circuit design. In step 350, the logic boundary that includes the candidate location can be identified. Accordingly, in step 355, each of the other locations within the logic boundary including the candidate location can be identified.

In step 360, a determination can be made as to whether any of the other locations within the logic boundary have been placed with circuit elements. Each such location within the logic boundary can be identified. If the logic boundary includes at least one location having another circuit element already placed thereto, the method can proceed to step 365. If no other circuit elements already have been placed at a location within the logic boundary, the method can proceed to step 380.

Continuing with step 365, each circuit element that has already been placed within the logic boundary can be analyzed to determine the particular partition to which each such circuit element belongs. If placement of circuit elements into a CLB or location boundary, as the case may be, is limited to circuit elements that are members of a same partition, then only the partition membership of a single circuit element that has already been placed in the logic boundary need be checked. Alternatively, when, or after, a first circuit element is placed into a logic boundary, a parameter indicating the partition membership of that circuit element can be set and associated with the logic boundary. Comparisons of the partition of the selected circuit element can be made with such an attribute rather than with one or more particular circuit elements already placed in the logic boundary.

In step 370, a determination can be made as to whether the selected circuit element belongs to the same partition as each circuit element that already has been placed in the location boundary. It should be appreciated that application of the instant validation check will prevent circuit elements of different partitions from being placed into a same CLB. If the partition of the selected circuit element is the same as the partition of each circuit element already placed in the logic boundary, the method can continue to step 380. If not, the method can proceed to step 375.

In step 375, where the partition of the selected circuit element has been determined to be different from the partition of one or more (or each) of the other circuit elements already placed in the logic boundary, the candidate location is rejected. Accordingly, a different candidate location must be found or determined for the selected circuit element. The method can loop back to step 330 to select another candidate location.

In step 380, in the case where the selected circuit element belongs to the same partition as the other circuit elements (or of each circuit element) already placed in the logic boundary, the selected circuit element can be, placed at the candidate location. The method can proceed to step 385 where a determination can be made as to whether more circuit elements of the circuit design remain to be placed. If so, the method can loop back to step 325. If not, the method can continue to step 390, where a placed circuit design is generated and provided as output. For example, the placed circuit design can be stored for further processing such as routing, optimization, further implementation flows in response to additional design changes, or conversion to a bitstream.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program", "software", "application", "computer-usable program code", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A computer-implemented method of placing circuit elements of a partitioned circuit design on a target programmable logic device (PLD), the method comprising:
   executing a program by a computer system to perform functions including:
      mapping circuit elements of the circuit design to corresponding partitions of the circuit design;
      defining a plurality of logic boundaries on the target PLD, wherein each logic boundary is defined by a plurality of logic cells directly connected to a routing matrix that is programmable to connect the logic cells;
      selecting a circuit element of the circuit design;
      selecting a candidate location within a logic boundary on the target PLD;
      wherein the candidate location is one the logic cells connected the routing matrix of the logic boundary;
      validating the candidate location for the selected circuit element, at least in part, according to whether the selected circuit element belongs to a same partition of the circuit design as at least one other circuit element already placed within the logic boundary;
      selectively placing the selected circuit element at the candidate location according to the validation;
      repeating the steps of selecting a circuit element, selecting a candidate location, validating, and selectively placing for each unplaced circuit element, wherein a placed circuit design is generated once all circuit elements have been placed; and
      outputting the placed circuit design.

2. The method of claim 1, wherein validating the candidate location for the selected circuit element comprises determining that no other circuit elements of the circuit design have been placed within the logic boundary, and wherein selectively placing the selected circuit element at the candidate location places the selected circuit element at the candidate location.

3. The method of claim 1, wherein validating the candidate location for the selected circuit element comprises identifying at least one other circuit element of the circuit design previously placed within the logic boundary.

4. The method of claim 3, wherein validating the candidate location for the selected circuit element further comprises comparing the partition of the selected circuit element with a partition of the at least one other circuit element previously placed within the logic boundary.

5. The method of claim 4, wherein selectively placing the selected circuit element at the candidate location further comprises placing the selected circuit component at the candidate location when the partition of the selected circuit element is the same partition to which the at least one other circuit element previously placed within the logic boundary belongs.

6. The method of claim 4, wherein selectively placing the selected circuit element at the candidate location further comprises rejecting the candidate location when the partition of the selected circuit element is not the same partition to which the at least one other circuit element previously placed within the logic boundary belongs.

7. The method of claim 1, wherein validating the candidate location for the selected circuit element comprises determining whether or not the partition of the selected circuit element is the same as a partition of each other circuit element previously placed within the logic boundary, and the selectively placing places the selected circuit element at the candidate location in response to the partition of the selected circuit element being the same as the partition of each other circuit element previously placed within the logic boundary, and the selectively placing does not place the selected circuit element at the candidate location in response to the partition of the selected circuit element being different from the partition of each other circuit element previously placed within the logic boundary.

8. The method of claim 1, further comprising processing further circuit elements and candidate locations to generate a placed circuit design.

9. A computer-implemented method of placing circuit elements of a partitioned circuit design on a target programmable logic device (PLD), the method comprising:
   executing a program by a computer system to perform functions including:
      defining a plurality of logic boundaries on the target PLD, wherein each logic boundary is defined by a plurality of logic cells directly connected to a routing matrix that is programmable to connect the logic cells;
      determining partition membership for circuit elements of the circuit design;
      selecting a circuit element of the circuit design and a candidate location within a logic boundary on the target PLD;
      wherein the candidate location is one the logic cells connected the routing matrix of the logic boundary;
      determining whether the logic boundary comprises at least one previously placed circuit element belonging to a partition;
      generating a placed circuit design by placing the circuit element at the candidate location when,
         a partition to which the selected circuit element belongs is the same partition to which the at least one previously placed circuit element belongs, or
         the logic boundary comprises no previously placed circuit elements; and
      outputting the placed circuit design.

10. The method of claim 9, further comprising, when the logic boundary comprises at least one previously placed circuit element, comparing the partition of the at least one previously placed circuit element with the partition of the selected circuit element.

11. The method of claim 9, further comprising, when the logic boundary comprises at least one previously placed circuit element belonging to a partition that is not the same as the partition of the selected circuit element, rejecting the candidate location and selecting a different candidate location.

12. A computer program product, comprising:
   a computer-usable storage device having computer-usable program code that generates a placed version of a circuit design having partitions for a target programmable logic device (PLD), the program code when executed by a processor causing the processor to perform the operations including:
      mapping circuit elements of the circuit design to corresponding partitions of the circuit design;
      defining a plurality of logic boundaries on the target PLD, wherein each logic boundary is defined by a plurality of logic cells directly connected to a routing matrix that is programmable to connect the logic cells;
      selecting a circuit element of the circuit design;
      selecting a candidate location within a logic boundary on the target PLD;
      wherein the candidate location is one the logic cells connected the routing matrix of the logic boundary;
      validating the candidate location for the selected circuit element, at least in part, according to whether the selected circuit element belongs to a same partition of the circuit design as at least one other circuit element already placed within the logic boundary;
      selectively placing the selected circuit element at the candidate location according to the validation;
      repeating the operations of selecting a circuit element, selecting a candidate location, validating, and selectively placing for each unplaced circuit element, wherein a placed circuit design is generated once all circuit elements have been placed; and
      outputting the placed circuit design.

13. The computer program product of claim 12, wherein the operation of validating the candidate location for the selected circuit element includes determining that no other circuit elements of the circuit design have been placed within the logic boundary, and wherein the computer-usable program code that selectively places the selected circuit element at the candidate location places the selected circuit element at the candidate location.

14. The computer program product of claim 12, wherein the operation of validating the candidate location for the selected circuit element includes identifying at least one other circuit element of the circuit design previously placed within the logic boundary.

15. The computer program product of claim 14, wherein the operation of validating the candidate location for the selected circuit element includes comparing the partition of the selected circuit element with a partition of the at least one other circuit element previously placed within the logic boundary.

16. The computer program product of claim 15, wherein the the operation of selectively placing the selected circuit element at the candidate location includes placing the selected circuit component at the candidate location when the partition of the selected circuit element is the same partition to which the at least one other circuit element previously placed within the logic boundary belongs.

17. The computer program product of claim 15, wherein the operation of selectively placing the selected circuit element at the candidate location includes rejecting the candidate location when the partition of the selected circuit element is not the same partition to which the at least one other circuit element previously placed within the logic boundary belongs.

18. The computer program product of claim 12, wherein the program code when executed by the processor further causes the processor to perform the operations of defining a plurality of logic boundaries on the target PLD, wherein each logic boundary is defined by a plurality of logic cells directly connected to a routing matrix.

19. The computer program product of claim 12, wherein the operation of validating the candidate location for the selected circuit element includes determining whether or not the partition of the selected circuit element is the same partition to which each other circuit element previously placed within the logic boundary belongs, and the operation of selectively placing places the selected circuit element at the candidate location, in response to the partition of the selected circuit element being the same as the partition of each other circuit element previously placed within the logic boundary, and the selectively placing does not place the selected circuit element at the candidate location in response to the partition of the selected circuit element being different from the partition of each other circuit element previously placed within the logic boundary.

* * * * *